US006336087B2

(12) United States Patent
Burgun et al.

(10) Patent No.: US 6,336,087 B2
(45) Date of Patent: Jan. 1, 2002

(54) METHOD AND APPARATUS FOR GATE-LEVEL SIMULATION OF SYNTHESIZED REGISTER TRANSFER LEVEL DESIGN WITH SOURCE-LEVEL DEBUGGING

(76) Inventors: Luc M. Burgun, 4 rue du Barrage, Creteil (FR), 94000; Alain Raynaud, LP 853, 3 Avenue du Canada-Batiment Sigma, 91975, Courtaboeuf Cedex (FR)

( * ) Notice: Subject to any disclaimer, the term of this patent is extended or adjusted under 35 U.S.C. 154(b) by 0 days.

(21) Appl. No.: 09/122,493

(22) Filed: Jul. 24, 1998

(51) Int. Cl.[7] .......................... G06F 17/50; G06F 11/00
(52) U.S. Cl. .................... 703/15; 703/14; 703/16; 716/3; 714/741
(58) Field of Search .................... 703/14, 15, 16, 703/17, 20, 27, 28; 716/4, 16, 2, 3

(56) References Cited

U.S. PATENT DOCUMENTS

| | | | | |
|---|---|---|---|---|
| 5,220,512 A | * | 6/1993 | Watkins et al. | 364/489 |
| 5,253,255 A | | 10/1993 | Carbine | 371/22.6 |
| 5,325,309 A | * | 6/1994 | Halaviati et al. | 364/488 |
| 5,423,023 A | * | 6/1995 | Batch et al. | 395/701 |
| 5,461,576 A | * | 10/1995 | Tsay et al. | 364/490 |
| 5,513,123 A | | 4/1996 | Dey et al. | |
| 5,519,627 A | * | 5/1996 | Mahmood et al. | 364/488 |
| 5,541,849 A | * | 7/1996 | Rostoker et al. | 364/489 |
| 5,544,067 A | * | 8/1996 | Rostoker et al. | 364/489 |
| 5,553,002 A | * | 9/1996 | Dangelo et al. | 364/489 |
| 5,555,201 A | * | 9/1996 | Dangelo et al. | 364/489 |
| 5,568,396 A | * | 10/1996 | Bamji et al. | 364/491 |
| 5,572,436 A | * | 11/1996 | Dangelo et al. | 364/489 |
| 5,598,344 A | * | 1/1997 | Dangelo et al. | 364/489 |
| 5,615,356 A | * | 3/1997 | King et al. | 395/500 |
| 5,623,418 A | * | 4/1997 | Rostoker et al. | 364/489 |
| 5,632,032 A | | 5/1997 | Ault et al. | 395/670 |
| 5,727,187 A | * | 3/1998 | Lemche et al. | 395/500 |
| 5,758,123 A | * | 5/1998 | Sano et al. | 395/500 |
| 5,768,145 A | * | 6/1998 | Roethig | 364/488 |
| 5,801,958 A | * | 9/1998 | Dangelo et al. | 364/489 |
| 5,835,380 A | * | 11/1998 | Roethig | 364/488 |
| 5,841,663 A | * | 11/1998 | Sharma et al. | 364/490 |
| 5,870,308 A | * | 2/1999 | Dangelo et al. | 364/489 |
| 5,870,585 A | | 2/1999 | Stapleton | 395/500 |

(List continued on next page.)

OTHER PUBLICATIONS

Chen et al., "A Source–Level Synamic Analysis Methodology and Tool for High–Level Synthesis", Proceedings of the Tenth International Symposium on System Synthesis, 1997, pp 134–140, Sep. 1997.

Koch et al., "Debugging of Behavioral VHDL Specifications by Source–Level Emulation", Proceedings of the European Design Automation Conference, pp. 256–261, Sep. 1995.

Kucukcakar et al., "Matisse: An Architectural Design Tool for Commodity IC's", IEEE Design & Test of Computers, vol. 15, Issue 2, pp. 22–33, Jun. 1998.

Fang et al., "A Real–Time RTL Engineering–Change Method Supporting On–Line Debugging for Logic–Emulation Applications", Proceedings of the 34th Design Automation Conference, pp. 101–106, Jun. 1997.

(List continued on next page.)

Primary Examiner—Kevin J. Teska
Assistant Examiner—William Thomson
(74) Attorney, Agent, or Firm—Columbia IP Law Group, PC

(57) ABSTRACT

Register transfer level (RTL) source code is synthesized to generate a gate-level representation and to generate instrumentation logic corresponding to one or more statements in the RTL source code. The instrumentation logic comprises logic circuitry in addition to that of the gate-level representation. The instrumentation logic indicates an execution status for the corresponding RTL statement(s) during gate-level simulation.

18 Claims, 22 Drawing Sheets

U.S. PATENT DOCUMENTS

| | | | | |
|---|---|---|---|---|
| 5,880,971 A | | 3/1999 | Dangelo et al. | 364/489 |
| 5,920,711 A | * | 7/1999 | Seawright et al. | 395/500 |
| 5,937,190 A | * | 8/1999 | Gregory et al. | 395/704 |
| 5,960,191 A | * | 9/1999 | Sample et al. | 395/500.49 |
| 5,991,533 A | * | 11/1999 | Sano et al. | 395/500.49 |
| 6,006,022 A | * | 12/1999 | Rhim et al. | 395/500.02 |
| 6,009,256 A | * | 12/1999 | Tseng et al. | 395/500.34 |
| 6,044,211 A | * | 3/2000 | Jain | 703/14 |
| 6,083,269 A | * | 7/2000 | Graef et al. | 703/14 |
| 6,134,516 A | * | 10/2000 | Wang et al. | 703/27 |

OTHER PUBLICATIONS

Howe, H., "Pre– and Postsynthesis Simulation Mismatches," IEEE International Conference on Verilog HDL 1997, pp. 24–31, Apr. 1997.

Orailoglu, A., "Microarchitectural Synthesis for Rapid BIST Testing," IEEE Transactions on Computer–Aided Design of Integrated circuits and Systems, vol. 16, Issue 6, pp. 573–586, Jun. 1997.

Postula et al., "A Comparison of High Level Synthesis and Register Transfer Design Techniques for Custom Computing Machines," Proc. of the 31$^{st}$ Hawaii International Conference on System Sciences, vol. 7, pp. 207–214, Jan. 1998.

Mesa Debugger Documentation, Version 5.0, Apr. 1979, Xerox.*

"How Debuggers Work Algorithms, Data Structures, and Architecture", Rosenberg, Sep. 27, 1996, Wiley Computer Publishing.*

* cited by examiner

ENTITY ALOOP IS

PORT(
    A : IN BIT_ VECTOR ( 0 TO 1 ) ;
    RESET : IN BOOLEAN;
    STATUS : OUT BOOLEAN ) ;

END ENTITY ALOOP ;

ARCHITECTURE RTL OF ALOOP IS

BEGIN

PROCESS ( A, RESET )

VARIABLE ZEROS, ONES : INTEGER ;

```
          BEGIN
410 ───▶  IF ( RESET )                          -- STATEMENT # 1
          THEN
420 ───▶      STATUS <= 0 ;                     -- STATEMENT # 2
          ELSE
430 ───▶      ZEROS := 0;                       -- STATEMENT # 3
440 ───▶      ONES := 0;                        -- STATEMENT # 4
450 ───▶      FOR I IN 0 TO 1 LOOP              -- STATEMENT # 5
460 ───▶          IF A ( I ) = '0'              -- STATEMENT # 6
                  THEN
470 ───▶              ZEROS := ZEROS + 1 ;      -- STATEMENT # 7
                  ELSE
480 ───▶              ONES := ONES + 1 ;        -- STATEMENT # 8
                  END IF ;
              END LOOP ;
490 ───▶      STATUS <= ( ZEROS > ONES ) ;      -- STATEMENT # 9
          END IF ;

END PROCESS ;
          END ARCHITECTURE ;
```

FIG. 6A

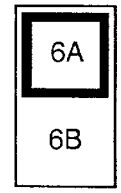

600

```
ENTITY ALOOP IS
PORT(
A : IN BIT_VECTOR (0 TO 1) ;
RESET : IN BOOLEAN ;
STATUS : OUT BOOLEAN ;
SIG_ TRACE1, SIG_ TRACE2, SIG_ TRACE3, SIG_ TRACE4, SIG_TRACE5,  ⎫ ~610
SIG_TRACE6 : OUT BIT                                            ⎭
);
END ENTITY ALOOP ;

ARCHITECTURE RTL OF ALOOP IS
BEGIN
PROCESS (A, RESET)
VARIABLE TRACE1, TRACE2, TRACE3, TRACE4, TRACE5, TRACE6 : BIT ; ⎫ ~612
VARIABLE ZEROS, ONES : INTEGER ;                                ⎭

BEGIN
TRACE1 :='0' ; TRACE2 :='0' ; ⎫
TRACE3 :='0' ; TRACE4 :='0' ; ⎬ ~620
TRACE5 :='0' ; TRACE6 :='0' ; ⎭
```

FIG. 6B

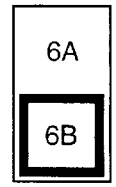

600

```
630──►TRACE1 := '1' ;                    -- INSTRUMENT STATEMENT #1
        IF (RESET)                       -- STATEMENT #1
        THEN
632────────►TRACE2 := '1' ;              -- INSTRUMENT STATEMENT #2
            STATUS <= FALSE ;            -- STATEMENT #2
        ELSE
634────────►TRACE3 := '1' ;              -- INSTRUMENT STATEMENT #3, #4, #5, #9
            ZEROS := 0 ;                 -- STATEMENT #3
            ONES := 0 ;                  -- STATEMENT #4
            FOR I IN 0 TO 1 LOOP         -- STATEMENT #5
636────────────►TRACE4 := '1' ;          -- INSTRUMENT STATEMENT #6
                IF A (I) ='0' ;          -- STATEMENT #6
                THEN
638────────────────►TRACE5 := '1' ;      -- INSTRUMENT STATEMENT #7
                    ZEROS := ZEROS +1 ;  -- STATEMENT #7
                ELSE
640────────────────►TRACE6 := '1' ;      -- INSTRUMENT STATEMENT #8
                    ONES := ONES +1;     -- STATEMENT  #8
                END IF;
            END LOOP;

642────────►  STATUS <= (ZEROS > ONES) ;    -- STATEMENT #9

END IF ;
        SIG_TRACE1 <= TRACE1 ; SIG_TRACE2 <= TRACE2 ; ⎫
        SIG_TRACE3 <= TRACE3 ; SIG_TRACE4 <= TRACE4 ; ⎬──650
        SIG_TRACE5 <= TRACE5 ; SIG_TRACE6 <= TRACE6 ; ⎭
        END PROCESS ;

END ARCHITECTURE ;
```

```
MODULE SAMPLE (RESET, D, CLK, Q) ;

INPUT RESET ;
INPUT D ;
INPUT CLK ;
REG Q ;
OUTPUT Q ;

ALWAYS @ (CLK OR RESET OR D)
BEGIN
        IF (RESET==1)
            Q <= 0 ;
        ELSE
            IF (CLK==1)
                Q <= D ;
END

ENDMODULE
```

```
MODULE SAMPLE
(RESET, D, CLK, Q, SIG_TRACE1, SIG_TRACE2, SIG_TRACE3, SIG_TRACE4) ;

INPUT RESET ;
INPUT D ;
INPUT CLK ;
REG Q ;
OUTPUT Q ;

REG SIG_TRACE1, SIG_TRACE2, SIG_TRACE3, SIG_TRACE4 ;
OUTPUT SIG_TRACE1, SIG_TRACE2, SIG_TRACE3, SIG_TRACE4 ;

INTEGER TRACE1, TRACE2, TRACE3, TRACE4 ;

ALWAYS @ (CLK OR RESET OR D)
BEGIN
      TRACE1 = 0 ; TRACE2 = 0 ; TRACE3 = 0 ; TRACE4 = 0 ;
      TRACE1 = 1 ;
      IF (RESET==1)
      BEGIN
            TRACE2 = 1 ;
            Q <= 0 ;
      END
      ELSE
      BEGIN
            TRACE3 = 1 ;
            IF (CLK== 1)
            BEGIN
                  TRACE4 = 1 ;
                  Q <= D ;
            END
      END
SIG_TRACE1 = TRACE1 ;
SIG_TRACE2 = TRACE2 ;
SIG_TRACE3 = TRACE3 ;
SIG_TRACE4 = TRACE4 ;
END

ENDMODULE
```

```
PROCESS (CLK, D, RESET)
BEGIN
        IF (RESET = '1') THEN
             Q <= '0' ;

ELSIF (CLK'EVENT AND CLK = '1') THEN
             Q <= D ;

END IF;

END PROCESS
```

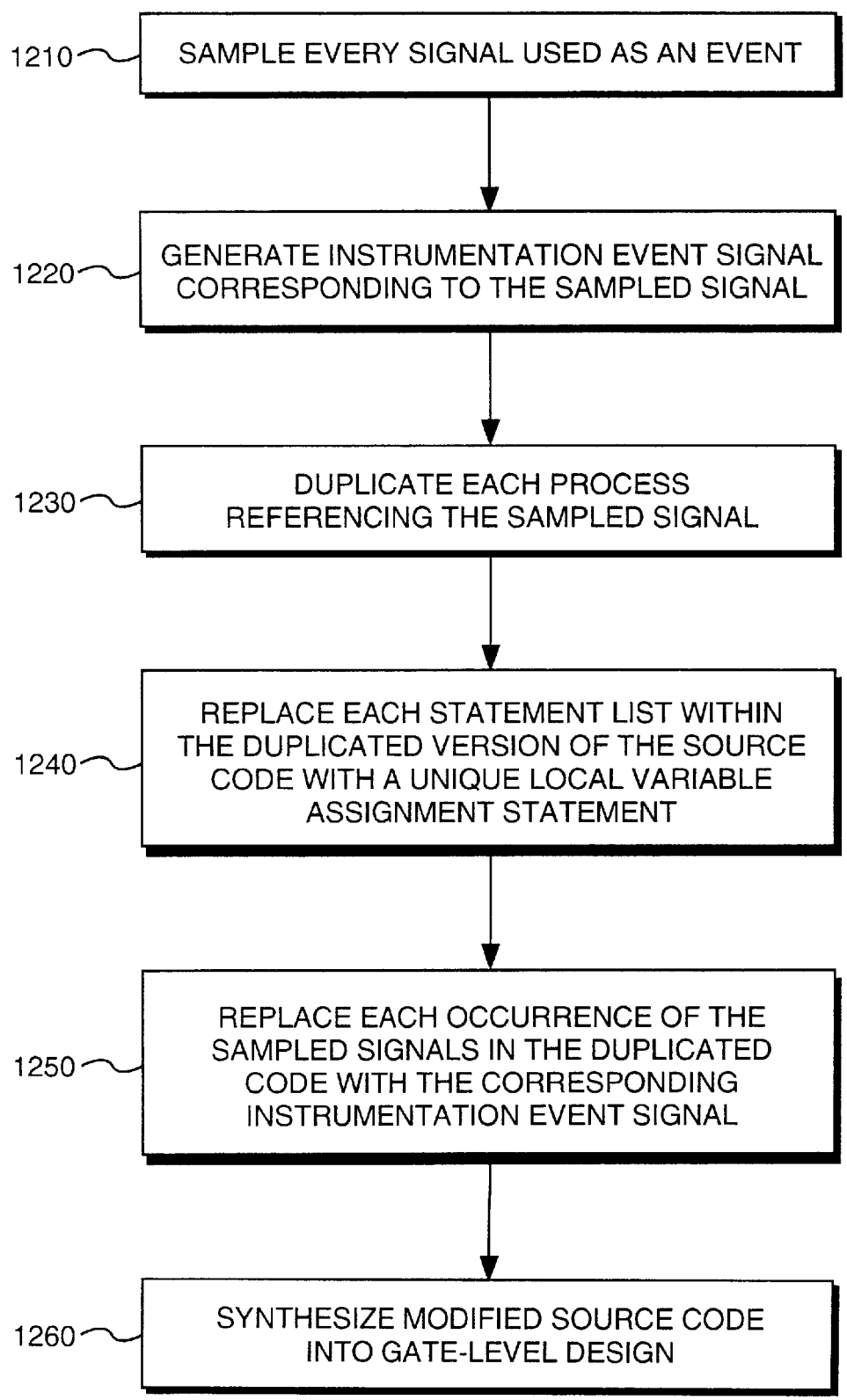

```
PROCESS (FAST_CLK)
BEGIN
    IF (FAST_CLK'EVENT AND FAST_CLK = '1')
    THEN
        SAMPLED_CLK <= CLK ;
    END IF
END PROCESS ;

CLK_EVENT <= SAMPLED_CLK / = CLK ;
CLK_STABLE <= SAMPLED_CLK = CLK ;
CLK_LASTVALUE <= SAMPLED_CLK ;
```
⎫ 1310

```
PROCESS (CLK, D, RESET, CLK _ EVENT)
    VARIABLE TRACE1, TRACE2 : BIT ;
BEGIN
    TRACE1 := '0' ; TRACE2 := '0' ;
    IF (RESET = '1') THEN
        TRACE1 := '1' ;

ELSIF (CLK_EVENT AND CLK = '1') THEN
        TRACE2 := '1' ;

END IF;
SIG_TRACE1 <= TRACE1 ;  SIG_TRACE2 <= TRACE2 ;
END PROCESS ;
```
⎫ 1320

```
PROCESS (CLK, D, RESET)
BEGIN
    IF (RESET = '1') THEN
        Q <= '0' ;
    ELSIF (CLK'EVENT AND CLK = '1') THEN
        Q <= D ;
    END IF ;
END PROCESS
```
⎫ 1330

```
ALWAYS @ (POSEDGE CLK OR NEGEDGE RESET)
BEGIN
        IF (RESET == 0)
                Q <= 0 ;
        ELSE
                Q <= D ;
END
```

```
ALWAYS @ (POSEDGE FAST_CLK)
BEGIN
      SAMPLED_CLK <= CLK
      SAMPLED_RESET <= RESET ;
END
ASSIGN CLK_EDGE = SAMPLED_CLK ^ CLK ;
ASSIGN RESET_ EDGE = SAMPLED_ RESET ^ RESET;

INTEGER TRACE1, TRACE2;
REG [1:0] SIG_ TRACE ;
ALWAYS @ (CLK_EDGE OR RESET_EDGE OR CLK OR RESET)
BEGIN
      TRACE1 = 0 ; TRACE2 = 0 ;
      IF ((CLK_EDGE == 1) && (CLK == 1)||(RESET_EDGE == 1) && (RESET == 0))
            IF (RESET == 0)
                  TRACE1 =1;
            ELSE
                  TRACE2 =1;
      SIG_TRACE[0] = TRACE1 ;
      SIG_TRACE[1] = TRACE2 ;
END

ALWAYS @ (POSEDGE CLK OR NEGEDGE RESET)
BEGIN

IF (RESET == 0)
           Q <=0 ;
      ELSE
           Q <= D ;
END
```

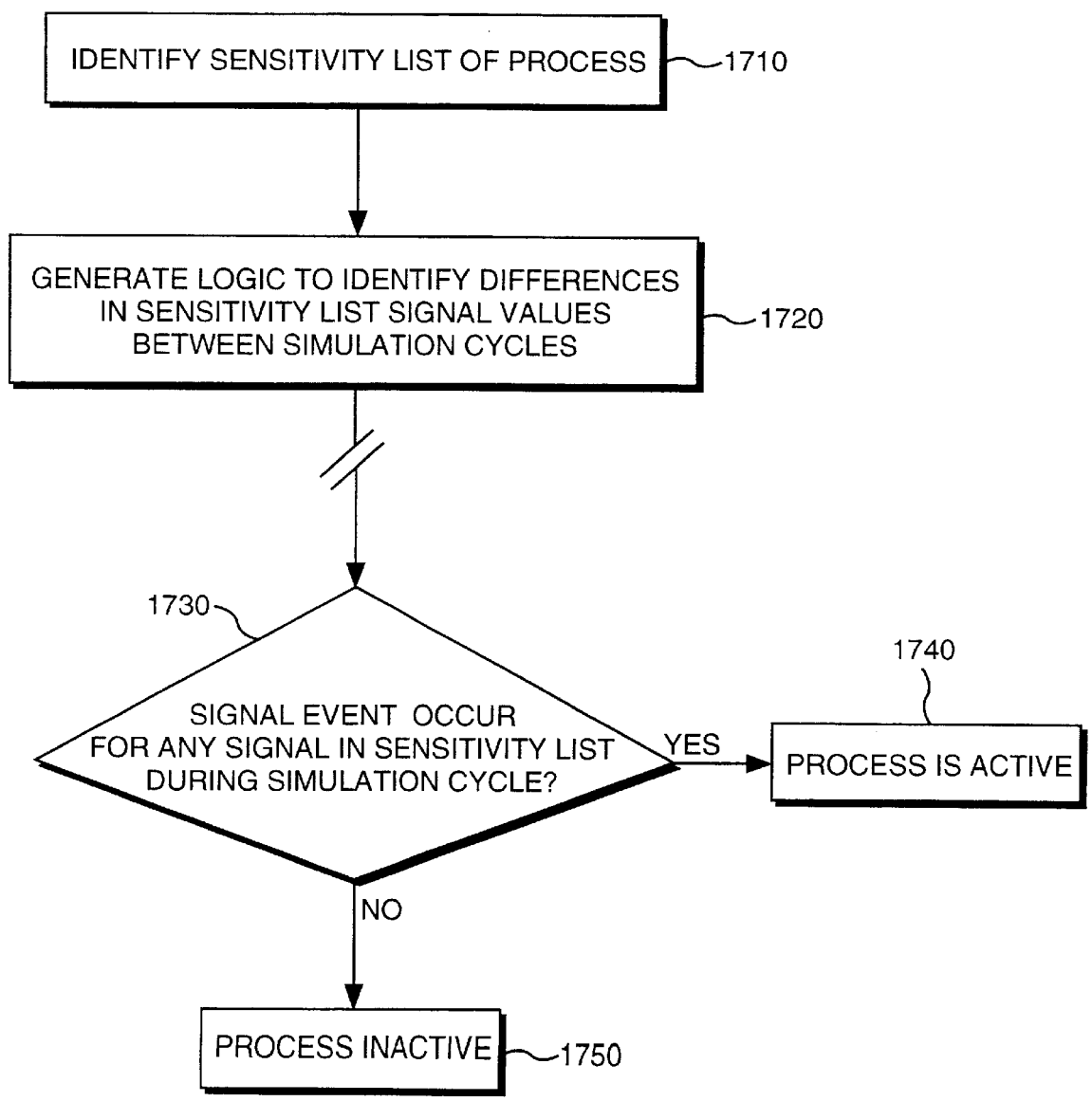

FIG. 18

P1: PROCESS (A,B,C)

```
PROCESS (FAST_CLK)
 BEGIN
        IF (FAST_ CLK'EVENT AND FAST_ CLK='1')
        THEN
                SAMPLED_A <=A ;
                SAMPLED_B <=B ;
                SAMPLED_C <=C ;
        END IF
        END PROCESS;
```
} 1810

```
P1_ ACTIVE <= (SAMPLED_A /= A)
      OR (SAMPLED_B /= B)
      OR (SAMPLED_C /= C);
```
} 1820

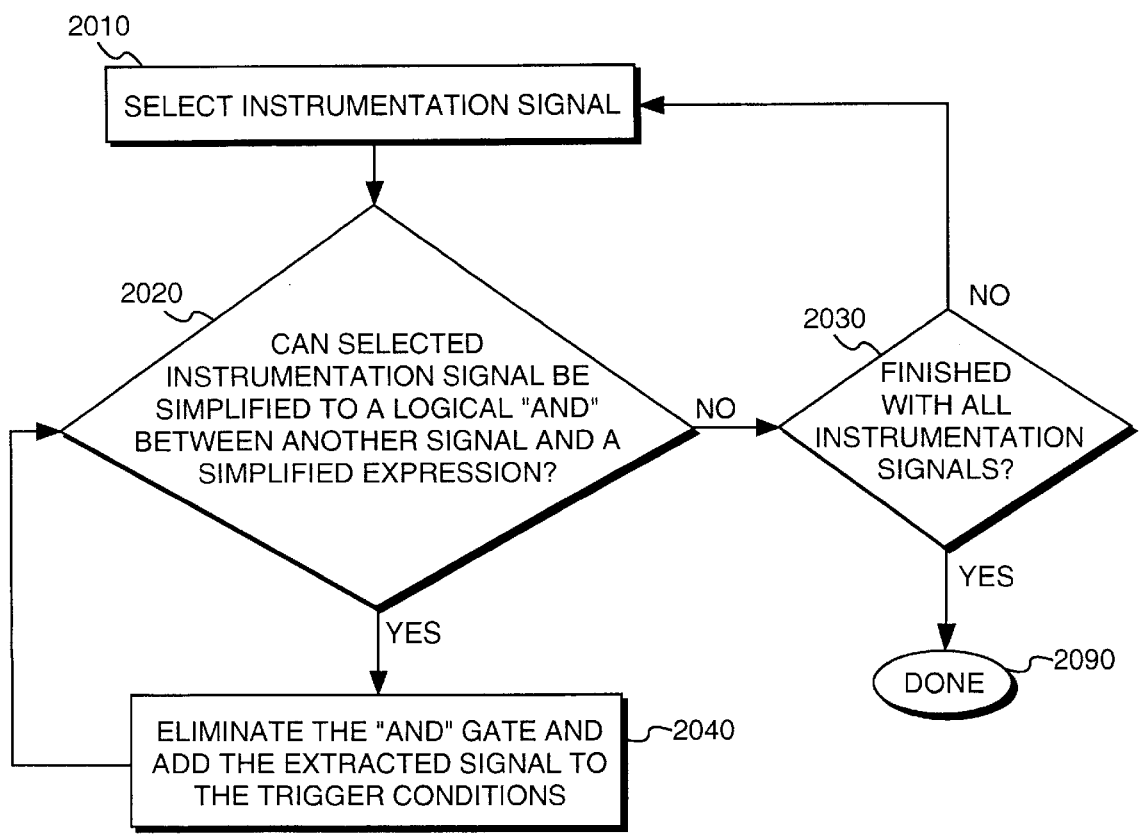

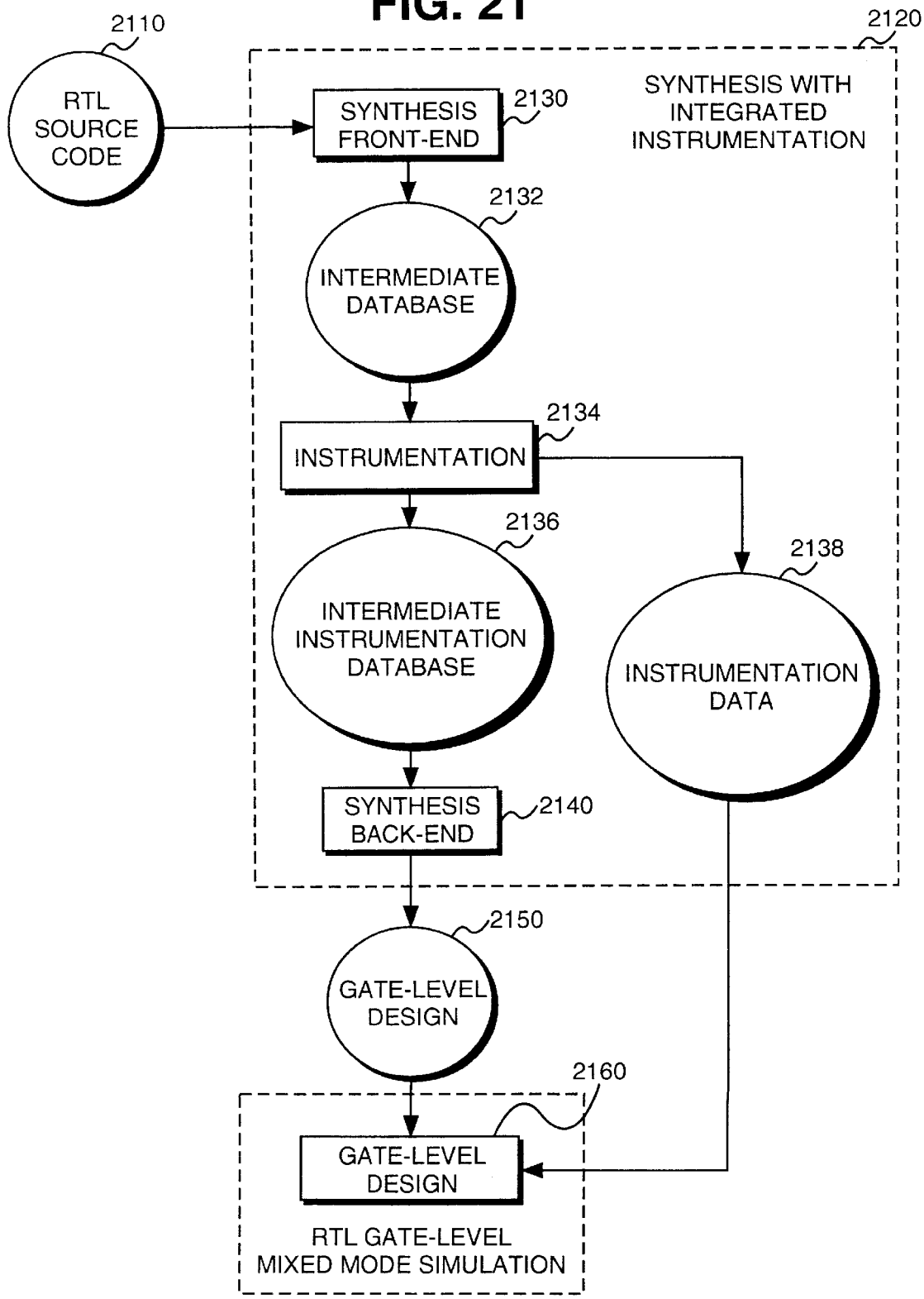

METHOD AND APPARATUS FOR GATE-LEVEL SIMULATION OF SYNTHESIZED REGISTER TRANSFER LEVEL DESIGN WITH SOURCE-LEVEL DEBUGGING

FIELD OF THE INVENTION

This invention relates to the fields of simulation and prototyping when designing integrated circuits. In particular, this invention is drawn to debugging synthesizable code at the register transfer level during gate-level simulation.

BACKGROUND OF THE INVENTION

Integrated circuit designers have adopted the use of high-level hardware description languages due in part to the size and complexity of modern integrated circuits. One such description language is Very High Speed Integrated Circuit (VHSIC) Description Language, or VHDL. Further information regarding VHDL may be found in the IEEE Standard VHDL Language Reference Manual (IEEE 1076-1987, IEEE 1076-1993). Another such description language is Verilog. These high level description languages are typically generically referred to as hardware description languages (HDLs).

Synthesis is the process of generating a gate-level netlist from the high-level description languages. Presently, synthesis tools recognize a subset of the high-level description language source code referred to as Register Transfer Level (RTL) source code. Further information regarding RTL source code may be found in the IEEE 1076.6/D1.10 Draft Standard for VHDL Register Transfer Level Synthesis (1997).

The RTL source code can be synthesized into a gate-level netlist. The gate-level netlist can be verified using gate-level simulation. The gate-level simulation can be performed using a software gate-level simulator. Alternatively, the gate-level simulation may be performed by converting the gate-level netlist into a format suitable for programming an emulator, a hardware accelerator, or a rapid-prototyping system so that the digital circuit description can take an actual operating hardware form.

Debugging environments for high-level hardware description languages frequently include a number of functionalities for analyzing and verifying the design when performing simulation. For example, a designer can typically navigate the design hierarchy, view the RTL source code, and set breakpoints on a statement of RTL source code to stop the simulation. Statements are usually identified by their line number in the RTL source code. In addition, the debugging environment often supports viewing and tracing variables and signal values. The RTL simulation environment typically offers such RTL debugging functionalities.

RTL simulation is typically performed by using software RTL simulators which provide good flexibility. However, for complex designs, a very large number of test vectors may need to be applied in order to adequately verify the design. This can take a considerable amount of time using software RTL simulation as contrasted with hardware acceleration or emulation starting from a gate-level netlist representation (i.e., "gate-level hardware acceleration," or "gate-level emulation"). Furthermore, it may be useful to perform in-situ verification, which consists of validating the design under test by connecting the emulator or hardware accelerator to the target system environment (where the design is to be inserted after the design is completed).

One disadvantage with gate-level simulation, however, is that most of the high-level information from the RTL source code is lost. Without the high-level information, many of the debugging functionalities are unavailable.

For example, the designer typically cannot set a breakpoint from the source code during gate-level simulation. Although signals can be analyzed during gate-level simulation, mapping signal values to particular source code lines can be difficult, if not impossible. If the source code is translated into a combinatorial logic netlist, for example, the designer cannot "step" through the source code to trace variable values. Instead, the designer is limited to analyzing the input vector and resulting output vector values. Although the signals at the inputs and outputs of the various gates may be traced or modified, these values are determined concurrently in a combinatorial network and thus such analysis is not readily mappable to the RTL source code.

A typical design flow will include creating a design at the RTL level, then synthesizing it into a gate-level netlist. Although simulation of this netlist can be performed at greater speeds using emulators or hardware accelerators, the ability to debug the design at the gate level is severely limited in comparison with software RTL simulation.

SUMMARY OF THE INVENTION

Methods of instrumenting synthesizable register transfer level (RTL) source code to enable debugging support akin to high-level language programming environments for gate-level simulation are provided.

One method of facilitating gate-level simulation includes the step of generating cross-reference instrumentation data including instrumentation logic indicative of the execution status of at least one synthesizable statement within the RTL source code. A gate-level netlist is synthesized from the RTL source code. Evaluation of the instrumentation logic during simulation of the gate-level netlist enables RTL debugging by indicating the execution status of the cross-referenced synthesizable statement in the RTL source code.

In one embodiment, the gate-level netlist is modified to provide instrumentation signals implementing the instrumentation logic and corresponding to synthesizable statements within the RTL source code. In various embodiments, this may be accomplished by modifying the RTL source code or by generating the modified gate-level netlist during synthesis as if the source code had been modified.

Alternatively, the gate-level netlist is not modified but the instrumentation signals implementing the instrumentation logic are contained in a cross-reference instrumentation database. In either case, the instrumentation signals indicate the execution status of the corresponding cross-referenced synthesizable statement. The instrumentation signals can be used to facilitate source code analysis, breakpoint debugging, and visual tracing of the source code execution path during gate-level simulation.

For example, a breakpoint can be set at a selected statement of the source code. A simulation breakpoint is set so that the simulation is halted at a simulation cycle where the value of the instrumentation signals indicate that the statement has become active.

With respect to visually tracing the source code during execution, the instrumentation logic is evaluated during gate-level simulation to determine a list of at least one active statement. The active statement is displayed as a highlighted statement.

With respect to source code analysis, cross-reference instrumentation data including the instrumentation signals can be used to count the number of times a corresponding statement is executed in the source code. For example, an execution count of the cross-referenced synthesizable statement is incremented when evaluation of the corresponding instrumentation logic indicates that the cross-referenced synthesizable statement is active.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 4 illustrates VHDL source code.

FIG. 6 illustrates the VHDL source code of FIG. 4 modified in accordance with the method of FIG. 3.

FIG. 8 illustrates sample Verilog source code before instrumentation.

FIG. 9 illustrates the Verilog source of FIG. 8 instrumented in accordance with the method of FIG. 3.

FIG. 11 illustrates Verilog source code for a D flip-flop with asynchronous reset.

FIG. 12 illustrates one method of instrumenting event-sensitive RTL source code.

FIG. 13 illustrates the source code of FIG. 11 modified in accordance with the instrumentation process of FIG. 12.

FIG. 15 illustrates Verilog source code for a D flip-flop with asynchronous reset.

FIG. 16 illustrates the Verilog source code of FIG. 15 after instrumentation in accordance with the method of FIG. 12.

FIG. 17 illustrates a method of instrumenting process activation.

FIG. 18 illustrates source code modified in accordance with the method of FIG. 17.

FIG. 19 illustrates an instrumented "case" statement.

FIG. 20 illustrates a process for decreasing the logic needed to instrument the source code.

FIG. 21 illustrates incorporating instrumentation within the synthesis process.

DETAILED DESCRIPTION

Figure 1:
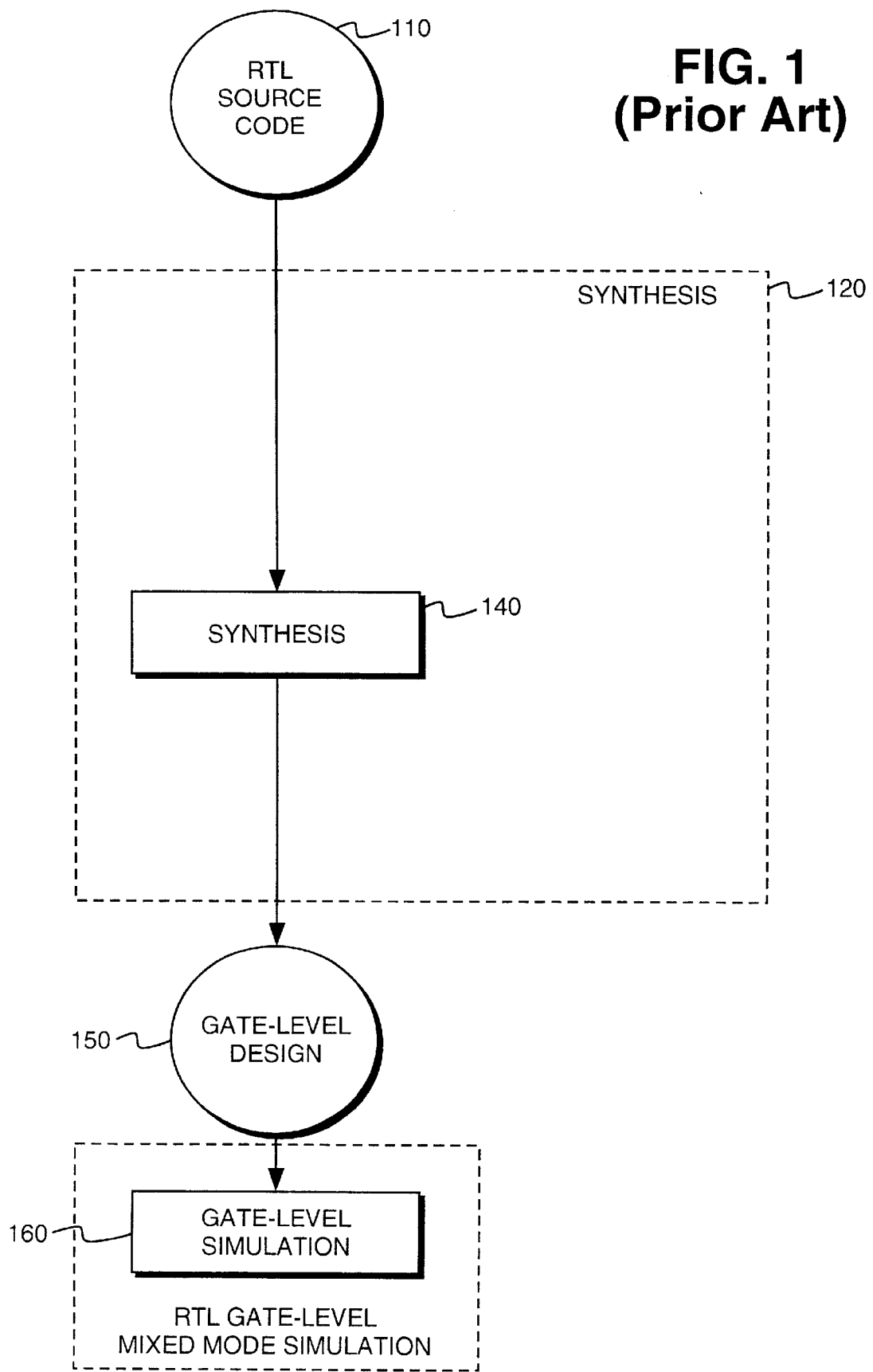
FIG. 1 illustrates the process of synthesizing RTL source code into a gate-level design.

FIG. 1 illustrates a typical RTL source code synthesis process. HDL code including synthesizable RTL source code (110) serves as input to a synthesis process 120. In one embodiment, the RTL source code 110 is synthesized in step 140 to produce a gate-level design 150. The gate-level design can be used for gate-level simulation as illustrated in step 160.

Typically the gate-level design comprises a hierarchical or flattened gate-level netlist representing the circuit to be simulated. The various signals in a design are referred to as nets. A hierarchical netlist is made of a list of blocks, whereas a flattened netlist comprises only one block. A block contains components and a description of their interconnection using nets. Components can be reduced to combinatorial or sequential logic gates, or they may be hierarchical blocks of lower level.

For example, the component may be a primitive gate denoting a single combinatorial logic function (e.g., AND, NAND, NOR, OR, XOR, NXOR, etc.) or a single storage element such as a flip-flop or latch for sequential logic. One example of a set of primitive gates is found in the generic library GTECH available from Synopsys, Inc. of Mountain View, Calif.

Alternatively the component may be an application specific integrated circuit (ASIC) library cell which can be represented by a set of primitive gates. One example of an ASIC library is the LCA300K ASIC library developed by LSI Logic, Inc., Milpitas, Calif.

A component may also be a programmable primitive that represents a set of logic functions and storage. One example of a programmable primitive is the configurable logic block (CLB) as described in The Programmable Gate array Handbook, Xilinx Inc., San Jose, 1993.

Another example of a component is a macro block denoting a complex logic function such as memories, counters, shifters, adders, multipliers, etc. Each of these can be further reduced to primitive gates forming combinatorial or sequential logic.

Three major categories of tools are available to the designer to simulate and test the design. Software RTL simulators (such as ModelSim™ from Model Technology, Inc.) typically offer a high-level of abstraction for their debugging environment, but have limited performance in terms of speed and no in-situ capacity. Software gate-level simulators (such as QuickSim™ from Mentor Graphics Corporation) typically offer limited level of abstraction and speed as well as no in-situ capacity. Hardware gate-level simulators (such as Cobalt™ and System Realizer™ from Quickturn Inc., Avatar™ from Ikos, and fast-prototyping systems usually built from FPGAs) typically offer very good performance in terms of speed and in-situ capacity, but a limited debugging environment.

When testing the design described by the HDL source code a designer may choose to simulate and validate the design at the RTL source code level (i.e., RTL simulation). RTL simulation typically permits the designer to set breakpoints in the source code, navigate the design hierarchy, view variables and signals and trace the value of these variables and signals.

When testing complex designs, millions or billions of test vectors may need to be applied in order to adequately test the design. Hardware accelerators or emulators can be used with the gate-level design to test the design at a much greater speed than what is typically possible through software simulation (i.e. either software RTL simulation or software gate-level simulation). Unfortunately, the gate-level design generated in step 150 typically includes none of the high-level information available in the RTL source code 110. As a result, features available during RTL simulation such as setting breakpoints or analyzing the source code coverage are not available during gate-level simulation.

Instrumentation is the process of preserving high-level information through the synthesis process. Instrumentation permits simulation of a gate-level netlist at the level of abstraction of RTL simulation by preserving some of the information available at the source code level through the synthesis process.

Figure 2:
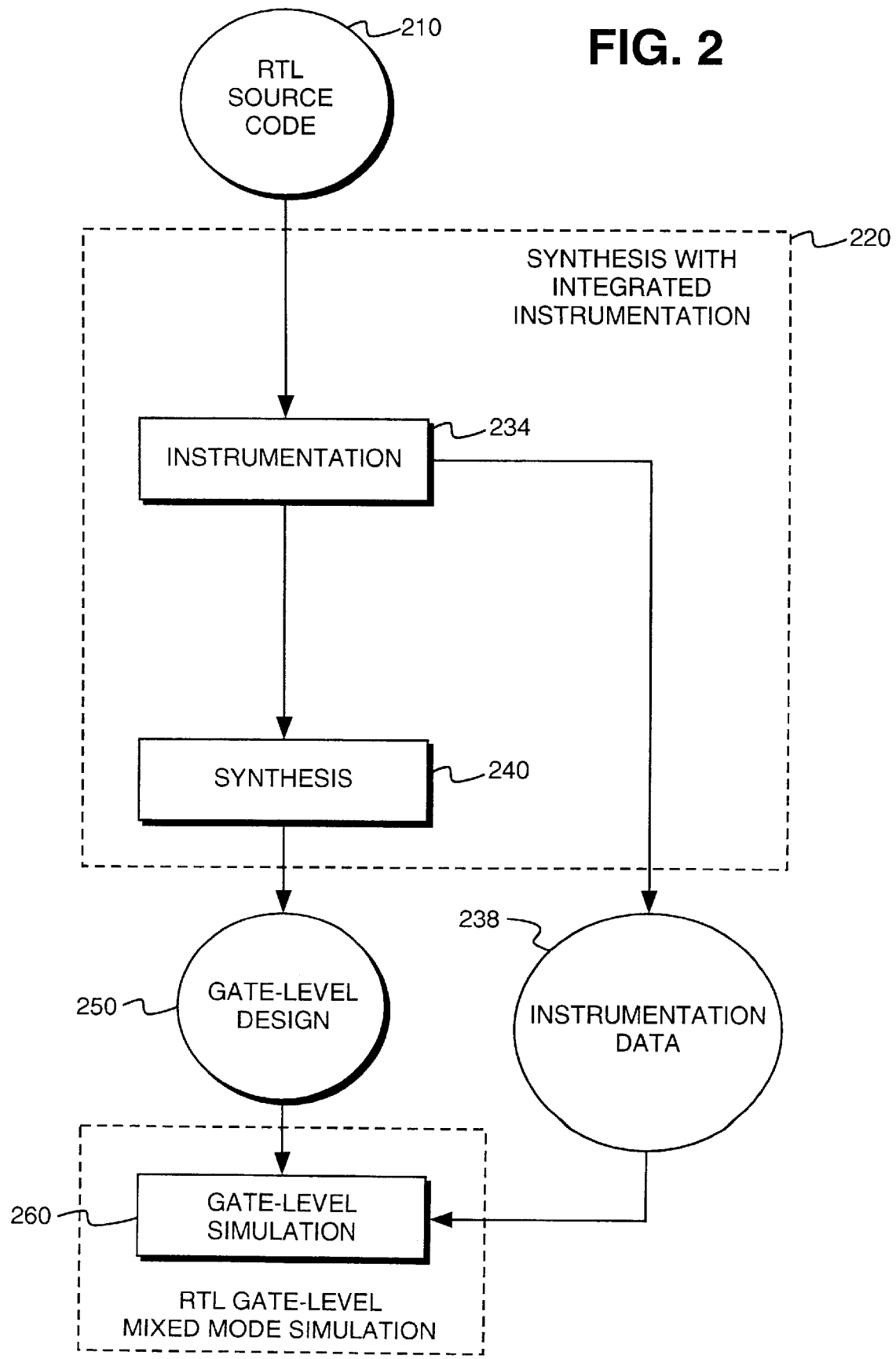
FIG. 2 illustrates one embodiment of a modified process for generating a gate-level design.

FIG. 2 illustrates one embodiment of the instrumentation process in which instrumentation is integrated with the synthesis process. RTL source code 210 is provided to the synthesis process 220. The synthesis process 120 of FIG. 1 has been modified to include an instrumentation step 234. After instrumentation the instrumented code is then synthesized in step 240 as the original RTL source code was in step 140 of FIG. 1.

In one embodiment, instrumentation results in generating a modified gate-level design to permit reconstitution of the flow of execution of the original RTL source code during gate-level simulation. Generally instrumentation logic is created for a synthesizable statement in the RTL source code either by modifying the RTL source code or by analyzing the RTL source code during the synthesis process. The instrumentation logic provides an output signal indicative of whether the corresponding synthesizable statement is active. A gate-level design including the instrumentation output signal is then synthesized. Referring to FIG. 2, the resulting gate-level design 250 contains additional logic to create the additional instrumentation output signals referenced in instrumentation data 238.

In an alternative embodiment, the RTL source code is analyzed to generate a cross-reference database as instrumentation data 238 without modifying the gate-level design. The cross-reference database indicates the combination of already existing signals in the form of instrumentation logic that can be evaluated during simulation to determine whether a particular line of the RTL source code is active. The cross-reference database contains a cross-reference between these instrumentation logic output signals and the position of the corresponding statement in the source code. The instrumentation data 238 is likely to contain considerably more complex logic to evaluate during simulation when the approach of not modifying the gate-level design (i.e., "pure" cross-reference database) is taken.

The two approaches have tradeoffs. The gate-level design modification technique does not require special knowledge of the target simulation environment. Moreover, the gate-level design modification technique significantly reduces or eliminates the complexity of the logic to be evaluated during simulation to the extent that emulator or accelerator hardware triggering circuitry can be used to take an action when the corresponding statement is executed.

For example, the hardware triggering circuitry may be used to halt the simulation at a particular statement or to count the number of times a particular statement is executed. The resulting gate-level design used during simulation, however, will not be the design actually used for production thus simulation may not verify accurately the behavior of the gate-level design used for production. Furthermore, simulation of modified gate-level design may require more physical resources in hardware than the original design alone if gates have been added in order to implement the instrumentation logic.

Alternatively, the pure cross-reference database technique typically results in greater complexity of instrumentation logic to evaluate during simulation, but does not otherwise affect the original gate-level design. The greater complexity, however, may prevent the use of the hardware triggering circuitry to halt the simulation or to track source code coverage. Thus the pure cross-reference database technique may result in a significantly slower simulation time. Furthermore, since the evaluation may be performed by software, direct verification of the gate-level design in the target system through in-situ verification may not be possible. The instrumentation data including the logic added for instrumentation purposes can be eliminated after testing, however, without disrupting the gate-level design.

In essence the gate-level design modification technique greatly simplifies the analysis and the instrumentation logic required for cross-referencing by modifying the gate-level design to create unique signals and therefore simpler logic to evaluate (i.e., a single signal). The resulting instrumentation logic cross-referenced in the instrumentation data 238 is easily evaluated during simulation. Various embodiments of instrumentation may combine the gate-level design modification technique or the pure cross-referencing technique in order to trade off simulation speed, density, and verification accuracy.

If the gate-level simulator, hardware accelerator, or emulator (e.g., through the use of a logic analyzer which can be external to the emulator) has the capacity to set breakpoints whenever certain signals reach a given value, then it is possible to implement breakpoints corresponding to RTL simulation breakpoints in the gate-level design. Whenever the user specifies a breakpoint in the RTL source code, the condition can be converted to a comparison with key signals in the gate-level design.

Instrumentation data 238 identifies the RTL source code statements each instrumentation output signal is associated with. Instrumentation data 238 is generated during the instrumentation process of step 234. In one embodiment, the instrumentation data is implemented as gates that can then be simulated by the target-level simulator. By examining the state of each instrumentation output signal during gate-level simulation, the user can determine which portions of RTL source code are being simulated. This in turn permits the designer to determine RTL source code coverage. By tracking the instrumentation signal values for each cycle of execution, the designer can determine how many times each line of the RTL source code has been activated.

The instrumentation data 238 can be used during simulation to ensure every possible state transition has been tested. For example, a Finite State Machine analyzer can determine from the values of the instrumentation output signals whether every possible state transition has been tested.

The instrumentation data 238 can also be used to enhance the source code display. In one embodiment, the source code is repositioned on the display so as to indicate the execution paths that are active during a current cycle. In another embodiment, the active source code in a given cycle is highlighted to indicate that it is active. This permits the designer to visually see the process flow without having to determine the value of each signal. In one embodiment, the instrumentation data 238 is used to enhance the display of the original RTL source code rather than the source code resulting from instrumentation.

An integrated circuit design is typically built by assembling hierarchical blocks. In VHDL, a block corresponds to an entity and architecture. In Verilog, a block corresponds to a module. In both HDLs, a block typically includes a declarative portion and a statement portion. The declarative portion generally includes the list of the ports or connectors.

The statement portion describes the block's behavior and is typically where a designer needs help when debugging a design. The statement portion includes concurrent signal assignment statements and sequential statements.

Concurrent signal assignment statements assign a logic expression to a signal. The signal is typically available for viewing at all times and thus breakpoints can be set in accordance with when the signals reach a certain value.

Sequential statements assign values depending upon the execution flow of the sequence. Sequential statement analysis is typically where the designer needs the greatest aids in debugging the design.

Sequential statements are typically found in VHDL "processes" and in Verilog "always" blocks. Processes or always blocks can be built of an unlimited combination of sequential statements including loops, conditional statements, and alternatives. There are at least two classes of sequential statements: level-sensitive and event-sensitive. Level-sensitive sequential statements only depend on the value of the inputs and can be synthesized to logic networks of combinatorial gates and latches. Event-sensitive sequential statements additionally require sequential logic such as flip-flops.

In one embodiment, level-sensitive RTL source code is instrumented by creating and associating one output signal with each list of synthesizable sequential statements. A list can consist of one or more sequential statements.

In one embodiment, each statement is a list. In an alternative embodiment, each list corresponds to a branch of the RTL source code. A list corresponding to a branch typically comprises a plurality of adjacent sequential statements, but may comprise a single sequential statement. Only one output signal is needed for each list of synthesizable sequential statements in a branch rather than for every sequential statement in the source code. Examples of sequential statements that create branches in the RTL source code are conditional statements such as IF-THEN statements and SELECT-CASE statements.

Figure 3:
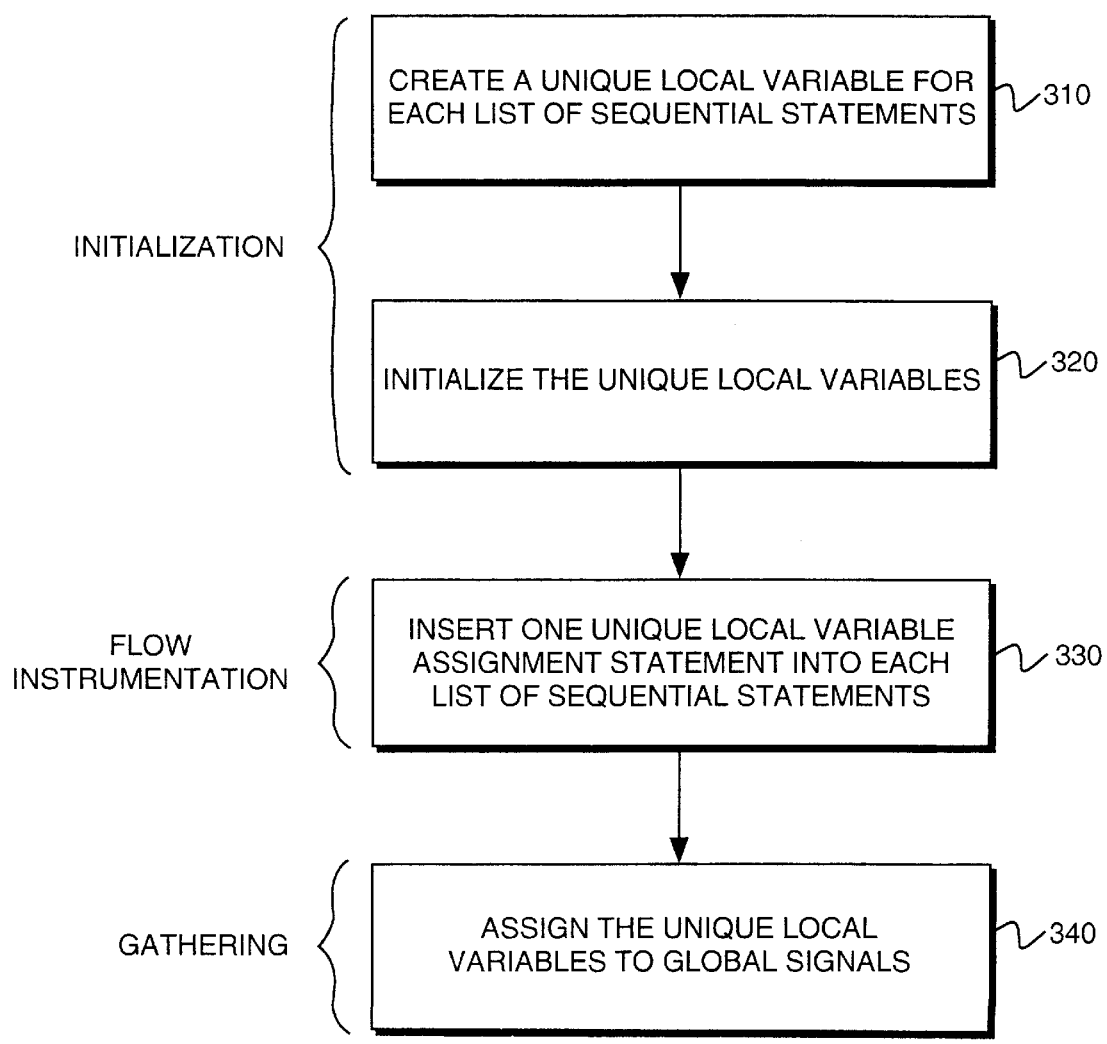
FIG. 3 illustrates one embodiment of a method for instrumenting level-sensitive RTL source code.

FIG. 3 illustrates one method of modifying RTL source code for level-sensitive code. Generally, a unique local variable is created for each list of adjacent sequential statements in step 310. The level sensitive code instrumentation includes the step of modifying the RTL source code to initialize each of these unique variables to zero at the beginning of the process being instrumented in step 320. One unique variable assignment statement is inserted into each list of adjacent sequential statements corresponding to an executable branch in step 330. The assignment statement sets the unique variable to one. At the end of the process all the unique local variables are assigned to global signals in step 340. Steps 310 and 320 are more generically referred to as initialization. Step 330 is referred to as flow instrumentation. Step 340 is referred to as "gathering."

FIG. 4 illustrates non-instrumented VHDL source code. The VHDL source code 400 includes nine sequential statements within the process block. Eight of these nine statements are non-signal assignment sequential statements. These eight sequential statements form six statement lists or executable branches of the code. IF-THEN statement 410 comprises one list. Signal assignment statement 420 comprises a second list. Statements 430, 440, 450 and 490 comprise a third list because they would be executed sequentially within the same execution path. Statements 460, 470, and 480 form individual lists.

Figure 5:
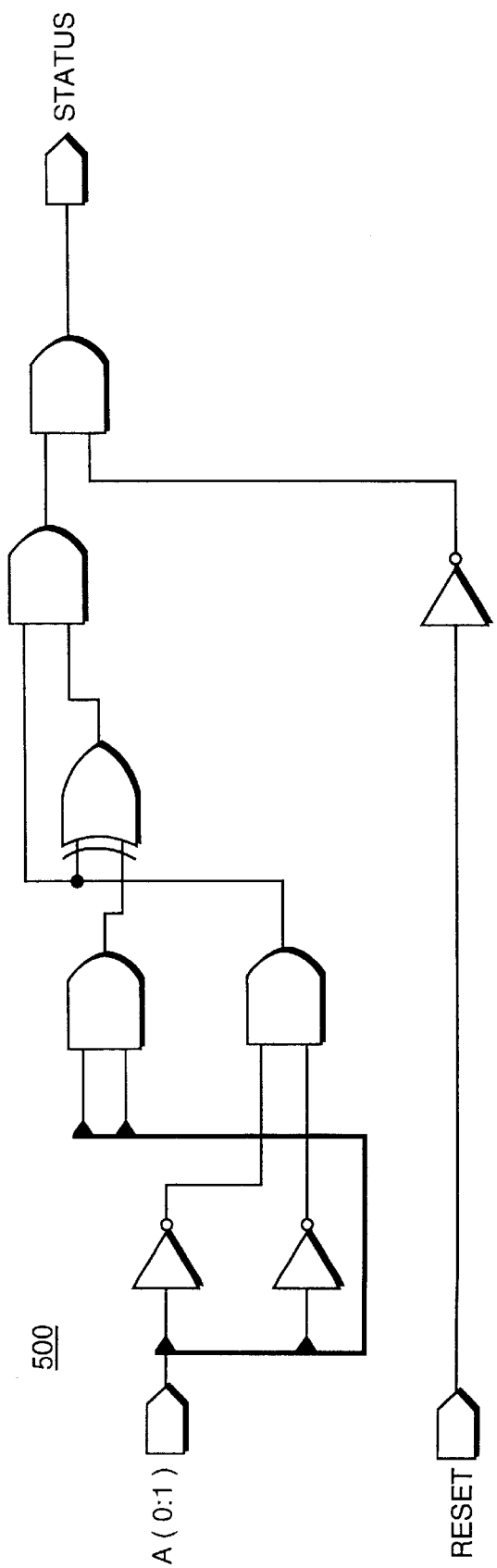
FIG. 5 illustrates the gate-level design synthesized from the RTL source code of FIG. 4.

FIG. 5 illustrates one embodiment of the logic 500 resulting from the synthesis of the RTL source code of FIG. 4. This figure may be used for comparison with the gate level design generated from instrumented code described below.

FIG. 6 illustrates the source code of FIG. 4 after instrumentation as described in FIG. 3. The added statements are italicized for emphasis. For example, line 612 has been added to the source code to create six unique local variables (TRACE1 through TRACE6), one for each of the six identified lists, in accordance with step 310 of FIG. 3.

In accordance with step 330 of FIG. 3, a trace variable assignment statement has been added adjacent to each of the lists. Referring to FIGS. 4 and 6, variable assignment statement 630 has been added adjacent to the first list comprising statement 410. Variable assignment statement 632 has been added adjacent to the second list comprising statement 420. Variable assignment statement 634 has been added adjacent to the third list comprising statements 430, 440, 450 and 490. Variable assignment statement 636 has been added adjacent to the fourth list comprising statement 460. Similarly, variable assignment statements 638 and 640 have been added adjacent to the fifth list comprising statement 470 and the sixth list comprising 480, respectively. Each of variable assignment statements 630 through 640 assigns a unique local variable the value of one.

Code portion 620 is added to initialize the unique local variables to zero at the beginning of the process in accordance with step 310 of FIG. 3.

Each of the local variables is assigned to a global output signal in accordance with step 340 of FIG. 3 by code portion 650. If required by the HDL, the global signals are declared by code portion 610. Similarly, the trace variables are declared by code portion 612.

In one embodiment, the unique local variables can actually be a single array where each "unique variable" or trace variable corresponds to a different position in the array. Similarly, in one embodiment, the additional global signals are described by an array where each of the global signals is represented by a different index of the array.

Coding practices for VHDL generally require variables to be used within the process and a signal assignment at the end of the process to propagate the variable values at the end of the process. In one embodiment, markers such as variable assignment statements are used to track the execution paths. Markers such as variable assignment statements are not typically synthesized into logic indicating the variable values, thus the variable assignment statements are used in conjunction with signal assignment statements in order to produce signals indicating whether various portions of the synthesized code are being executed.

If permitted by the HDL, however, global signal assignments can be used in lieu of local variable assignment statements. This would simplify the process of FIG. 3 in that there would be no need to create or initialize local variables. In addition the step of assigning the local variables to global signals could be eliminated because values are assigned directly. The key is ensuring that there is a unique output signal created and associated with each list of sequential statements regardless of the coding practice used to achieve this goal.

Figure 7:
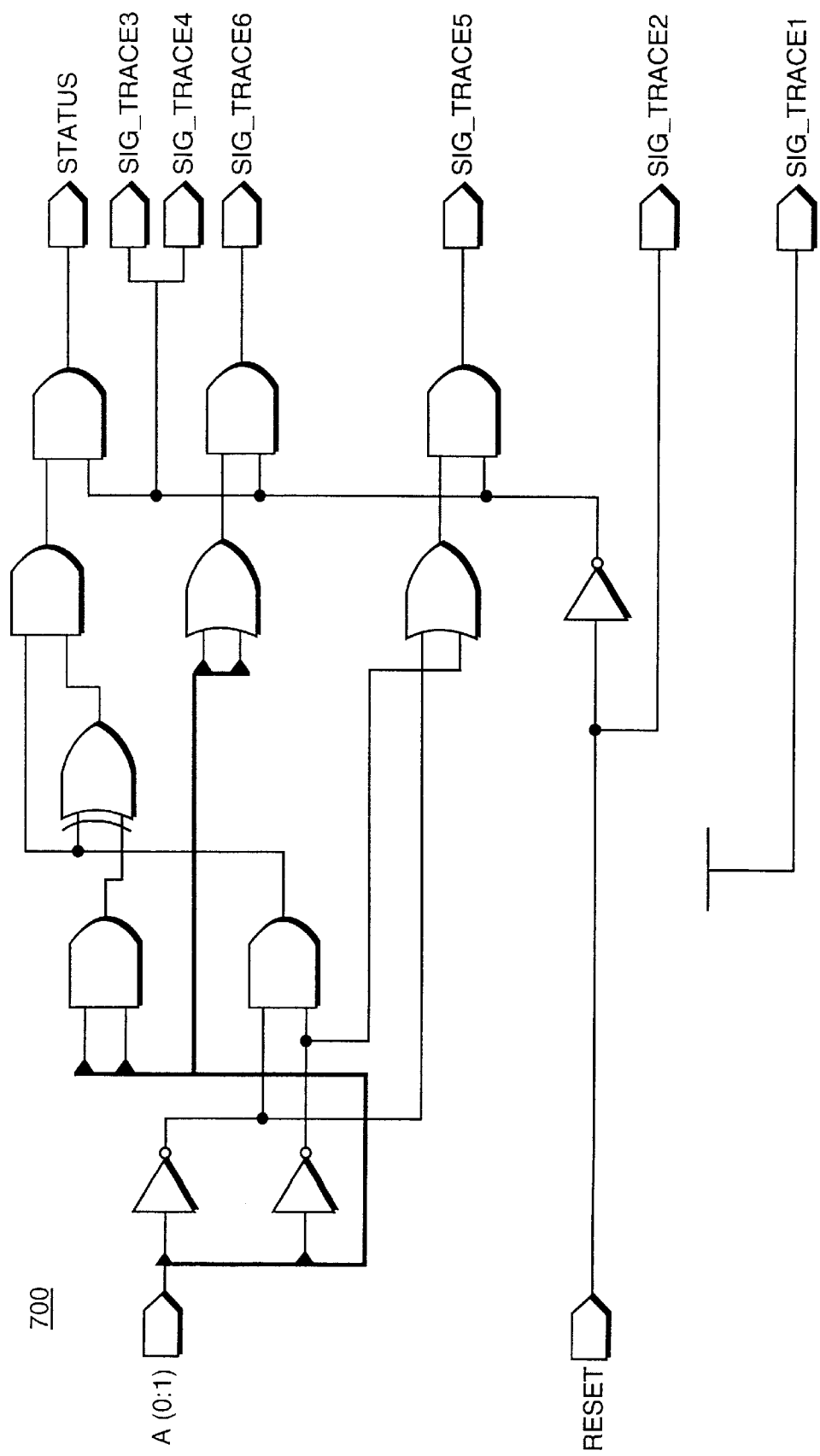
FIG. 7 illustrates one embodiment of the gate-level logic synthesized from the modified RTL source code.

FIG. 7 illustrates one embodiment of the logic 700 generated through instrumentation. In particular, FIG. 7 illustrates the additional gate-level logic added to generate signals SIG_TRACE1 through SIG_TRACE6 from synthesis of the modified source code.

FIG. 8 illustrates a Verilog "always" block 800. FIG. 9 illustrates the same code after instrumentation in accordance with the process of FIG. 3. Due to Verilog syntax requirements, "BEGIN-END" statements were used to properly group the instrumentation variable with the other statements in each executable path.

Although the code of FIG. 8 results in a latch, application of the technique of FIG. 3 to the source code of FIG. 8 ensures that the instrumentation output signals are the result of combinatorial logic only. Thus the logic for determining which lines of code are active can be purely combinatorial even when the RTL source code is synthesized into latches.

Figure 10:
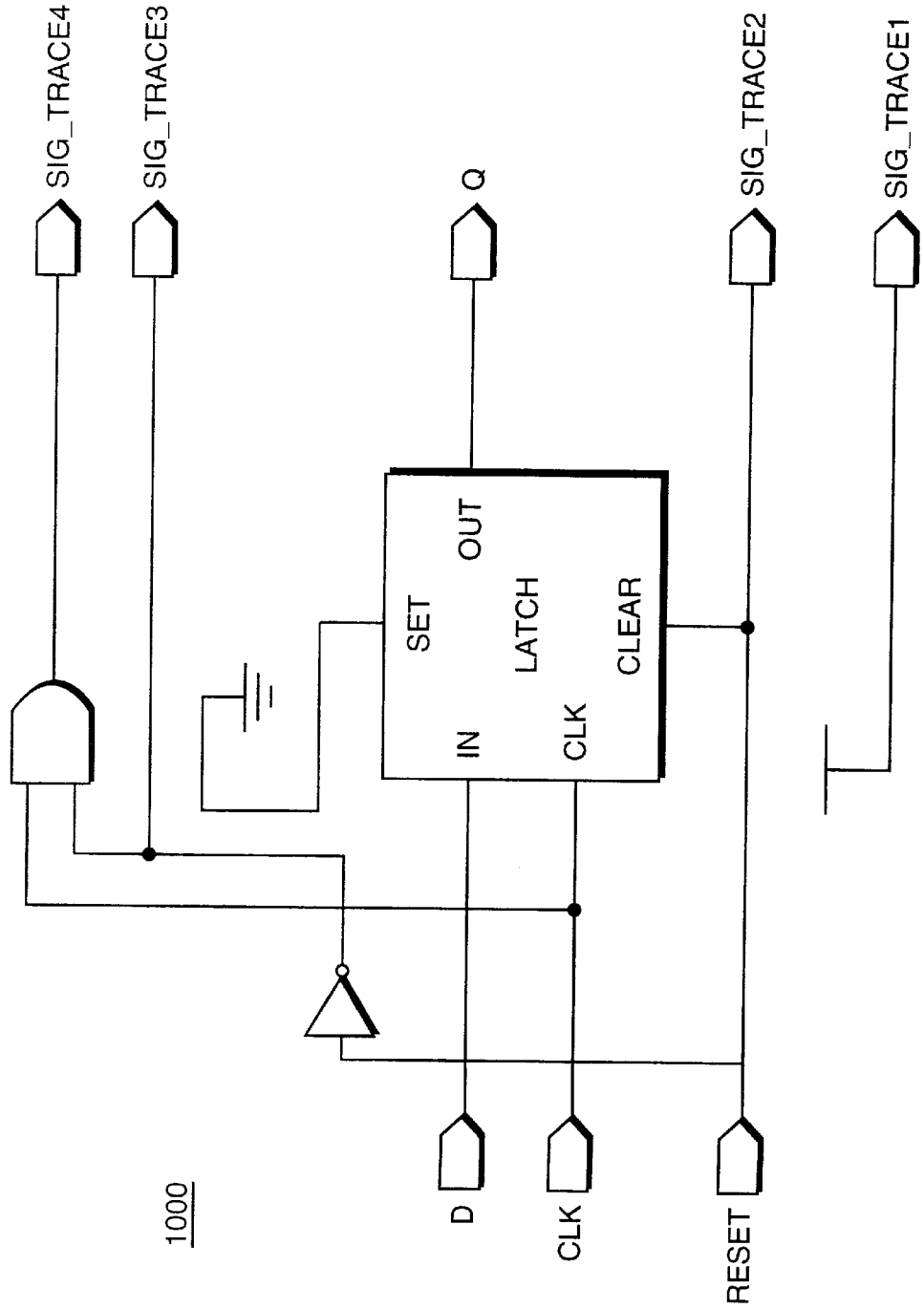
FIG. 10 illustrates the gate-level logic synthesized from the instrumented Verilog source code of FIG. 9.

FIG. 10 illustrates one embodiment of gate-level logic 1100 generated by synthesis of the instrumented "always" block 900 of FIG. 9. The instrumentation signals SIG_TRACE1, SIG_TRACE2, SIG_TRACE3, and SIG_TRACE4 are the result of combinatorial logic only.

Referring to FIG. 2, the instrumentation data 238 can be stored in a cross-reference file. In one embodiment, the cross-reference file contains a mapping between original source code line numbers and instrumentation signals. Each time an instrumentation variable (and its associated signal) is added to the source code, all the line numbers of the statements in the list associated with the instrumentation variable are added to the file. This cross-reference file (i.e., instrumentation data 238) can be used by the gate-level simulation environment to convert the designer's breakpoints into actual conditions on instrumentation signals.

A more sophisticated method than that illustrated in FIG. 3 is required to instrument RTL source code having references to signal events. Typically such source code is used to describe edge-sensitive devices. References to signal events typically imply flip-flops. A signal event is a signal transition. Thus any signal computed from a signal transition references a signal event.

FIG. 11 illustrates sample VHDL code 1100 with references to a signal event. VHDL code 1100 implements a D-type flip-flop with asynchronous reset. The event in this example is a transition on the clock signal (CLK) as referenced by the term "CLK'EVENT."

In accordance with VHDL specifications signals can have various attributes associated with them. A function attribute executes a named function on the associated signal to return a value. For example, when the simulator executes a statement such as CLK'EVENT, a function call is performed to check this property of the signal CLK. In particular, CLK'EVENT returns a Boolean value signifying a change in value on the signal CLK. Other classes of attributes include value attributes and range attributes.

In VHDL code 1100, the signal CLK has a function attribute named "event" associated with it. The predicate CLK'EVENT is true if an event (i.e., signal transition) has occurred on the CLK signal. Assigning a value to a signal (i.e., a signal transaction) qualifies as an event only if the transaction results in a change in value or state for the signal. Thus the predicate CLK'EVENT is true whenever an event has occurred on the signal CLK in the most recent simulation cycle. The predicate "IF (CLK'EVENT and CLK='1')" is true on the rising edge of the signal CLK.

Depending upon the specifics of the HDL, another function such as RISING_EDGE(CLK) might be used to accomplish the same result without the use of attributes. The function RISING_EDGE(CLK) is still an event even though the term "event" does not appear in the function.

FIG. 12 illustrates a method of instrumenting source code having references to signal events. In step 1210, every signal event is sampled using a fast clock. In other words, every signal whose state transition serves as the basis for the determination of another signal is sampled. An instrumentation signal event corresponding to the original signal event is generated in step 1220. Any attributes of the original signal must similarly be reproduced based on the instrumentation signal if the source code uses attributes of the original signal event.

In step 1230, every process that references a signal event is duplicated. In step 1240, each list of sequential statements within the duplicate version of the code is replaced by a unique local variable assignment statement. In step 1250, each time a signal event is referenced in the duplicated version of the code, it is replaced by the sampled signal event computed in step 1210. The modified RTL source code can then be synthesized in step 1260 to generate gate-level logic including the instrumentation output signals.

FIG. 13 illustrates application of the method of FIG. 12 to the source code of FIG. 11. In order to detect signal events properly for instrumentation, the signal events are sampled using a fast clock provided during gate-level simulation (i.e., FAST_CLK). FAST_CLK has a higher frequency than the CLK signal and thus permits detecting transition edges before signals depending upon CLK (including CLK itself) can.

The only signal event referenced in FIG. 11 is a transition in the signal CLK indicated by the term CLK'EVENT. Thus an instrumentation version of CLK'EVENT is created by sampling the signal CLK using FAST_CLK. The signal FAST_CLK has a higher frequency than the signal CLK.

Code portion 1310 samples the CLK signal on every rising edge of the signal FAST_CLK to generate a sampled version of the signal CLK named SAMPLED_CLK. The instrumentation version of CLK'EVENT is CLK_EVENT which is generated in code portion 1310 based on SAMPLED_CLK. The instrumentation signal CLK_EVENT (corresponding to CLK'EVENT) is determined by comparison of signals SAMPLED_CLK and CLK. The signal CLK_EVENT is true only when the signal SAMPLED_CLK is not the same as CLK, thus indicating a transition has occurred in the signal CLK.

Although not required for this example, code portion 1310 also illustrates the generation of instrumentation clock signal attributes based on SAMPLED_CLK. For example, the signal CLK'STABLE is the complement of CLK'EVENT. Thus code portion 1310 indicates the instrumentation version of the attribute CLK'STABLE (i.e., CLK_STABLE) computed on the instrumentation clock signal (i.e., SAMPLED_CLK). The signal CLK'LASTVALUE is a function signal attribute that returns the previous value of the signal CLK. The instrumentation version (i.e., CLK_LASTVALUE) of the attribute CLK'LASTVALUE is similarly computed on the instrumentation clock signal, SAMPLED_CLK.

Although CLK_LASTVALUE is the same as the sampled clock signal, SAMPLED_CLK, code 1310 introduces the intermediate signal SAMPLED_CLK for purposes of illustrating sampling of the CLK signal. The signal CLK_LASTVALUE can be defined in lieu of SAMPLED_CLK in order to eliminate the introduction of an unnecessary intermediate signal SAMPLED_CLK and the subsequent step of assigning CLK_LASTVALUE the value of SAMPLED_CLK.

Neither CLK_LASTVALUE nor CLK_STABLE are needed in this example for code portion 1320, however, code portion 1310 serves as an example of how to generate instrumentation versions of signal attributes typically used to describe edge-sensitive devices.

Code portion 1320 represents the instrumented duplicate of original code portion 1330. The process of code portion 1330 references the event CLK'EVENT in the IF-ELSIF statement. In code portion 1320, all sequential statements (except the statement referencing an event) have been replaced with unique local variable assignment statements.

These statements assign a local variable (i.e., TRACE1, TRACE2) the value "1." Code portion 1320 also includes statements to create and initialize these unique local variables.

Figure 14:
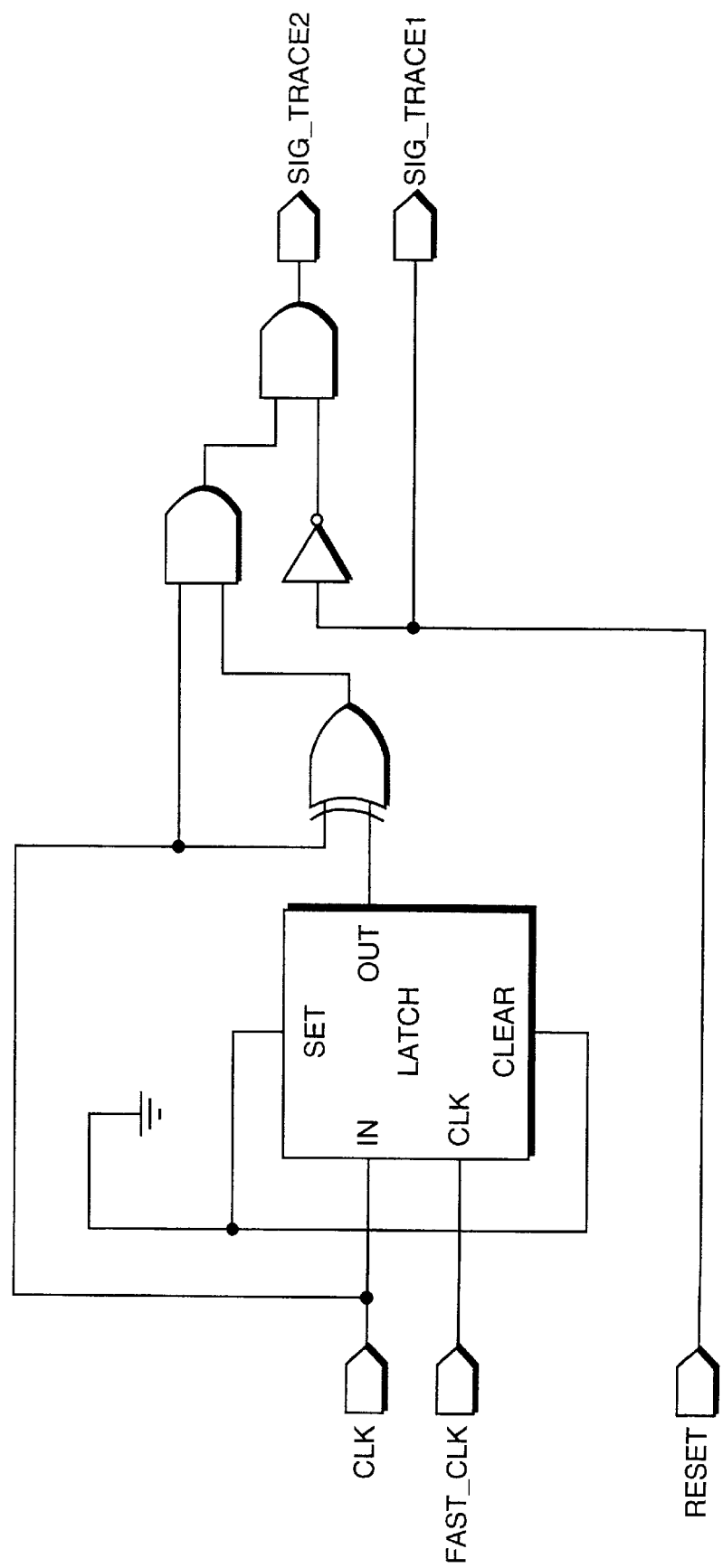
FIG. 14 illustrates the gate-level logic synthesized for the instrumented source code of FIG. 13.

In accordance with step 1240, every occurrence of a signal event is replaced with the sampled version of that event. Thus, for example, references to CLK'EVENT in code portion 1330 are replaced with references to CLK_EVENT in code portion 1320. Moreover, the process parameter list is modified to include the generated signal CLK_EVENT. FIG. 14 illustrates the gate-level logic 1400 resulting from synthesis of the code in FIG. 13.

FIG. 15 illustrates Verilog source code 1500 for a D flip-flop with asynchronous reset. FIG. 16 illustrates the code 1600 resulting from modifying source code 1500 in accordance with the method of FIG. 12.

One advantage of the instrumentation approach of FIG. 12 is that the gates generated by the synthesis tool are the same ones that would be generated if the source code had not been instrumented. The gates generated for the instrumentation logic are not intermingled with the gates generated from the non-instrumented source code. This permits design verification with gate-level logic that does not need to be re-verified after instrumentation verification. Thus the designer can verify the result of synthesis at the gate level while retaining RTL breakpoint feature. In some cases, however, the synthesis tool may not recognize that the same code appears twice. This may incur an additional relatively expensive phase of resource sharing in order to achieve the same performance results as the process illustrated in FIG. 3.

One advantage of the instrumentation process of FIG. 3 over that of FIG. 12, however, is that a synthesis tool can typically analyze the source code to detect obvious resource sharing.

The instrumentation methods of FIGS. 3 and 12 permit detecting any path that has been taken while a VHDL process or a Verilog "always" block is active. Tracking the activation of each process permits further analysis.

FIG. 17 illustrates a method of instrumenting the activation of the processes (or "always" blocks) themselves for subsequent determination of whether the process is active during gate-level simulation.

In step 1710, the sensitivity list of a process is identified. In step 1720, logic is generated to compare the signals in the sensitivity list between consecutive simulation cycles. Subsequently, during gate-level simulation in step 1730, a determination is made as to whether an event has occurred on any of the sensitivity list signals. Each simulation cycle that a signal indicates a difference (i.e., a signal event has occurred), the process is active as indicated by step 1740. Otherwise, if no events have occurred on any of the sensitivity list signals, the process is inactive as indicated by step 1750.

FIG. 18 illustrates the code added to determine if process P1 is active. The added code is italicized. The sensitivity list of process P1 includes signals a, b, and c. In accordance with step 1720 of FIG. 17, code section 1810 creates sampled versions of a, b, and c using FAST_CLK as described above. The sampled versions of a, b, and c are SAMPLED_A, SAMPLED_B, and SAMPLED_C, respectively.

Code section 1820 determines if an event has occurred on each of the sensitivity list signals. The test "(SAMPLED_A/=A)" is true if an event occurs with respect to signal A. Similarly "(SAMPLED_B/=B)" and "(SAMPLED_C/=C)" indicate whether an event has occurred with respect to signals B and C. Process P1 is active if any one of these tests is true. Thus the variable P1_ACTIVE is generated by combining each of these signal events using the logical OR function in code section 1820. Thus signal P1_ACTIVE indicates whether process P1 is active.

Process instrumentation data can be added to the instrumentation data cross-reference file in order to enhance the source code display. For example, the active process in a given cycle can be highlighted to indicate it is active. This permits the designer to visually see the active processes without having to determine the value of each signal. In one embodiment, the instrumentation data is used to enhance the display of the original RTL source code rather than the source code resulting from instrumentation.

The instrumentation techniques presented result in gate level designs providing explicit instrumentation signals to indicate that some specific portion of the source code is active. The number of instrumentation signals tends to increase with the complexity of the system being modeled.

Some optimizations may be performed to decrease the number of instrumentation signals. At least one execution path will be active any time a process is activated. As a result, the TRACE1 variable in the examples of FIGS. 6 and 9 tend to provide no additional information and thus SIG_TRACE1 is somewhat trivial as can be seen from the synthesized logic of FIGS. 7 and 10. Thus at least one trace variable (and therefore one output signal trace) can typically be eliminated.

In some cases the execution status of each branch of the code can be determined even though every branch is not explicitly instrumented. To verify the execution status of every branch, the instrumentation process need only ensure that each branch is instrumented either explicitly or implicitly through the instrumentation of other branches.

In some instances, the capacity of hardware triggers can be used to eliminate some of the instrumentation by combining several signals into one condition. The number of gates simulated can be reduced by replacing logical AND conditions that appear in the equations of instrumentation signals by simulator-specific triggers.

For example, consider the instrumented CASE statement code fragment 1910 illustrated in FIG. 19. For purposes of example, only the trace variable assignment statements are shown for the four possible cases. A synthesis tool will generate four comparisons with the vector "opcode." Each trace variable is associated with one of the possible values of opcode. Clearly, however, the additional logic is unnecessary because setting a breakpoint on any one of the case conditions corresponds to setting a trigger on the vector for the corresponding value of "opcode."

FIG. 20 illustrates a method for optimizing the instrumentation process. In particular, an instrumentation signal is selected in step 2010. In step 2020, a determination is made as to whether the equation of the current signal can be expressed as a logical AND between a signal and a simplified expression. If so, then the AND gate should be eliminated in step 2030 and the extracted signal can be added to the trigger conditions during simulation in step 2040. If triggers can be activated on zeroes as well as ones, then step 2020 can also determine whether an equation can be simplified as a logical negation of a subexpression and the logical negation of the subexpression can be added to the trigger conditions during simulation in step 2040 where appropriate. Step 2020 would then be applied recursively until the equation cannot be further simplified. This process is then applied to all of the instrumentation signals.

For example, signal TRACE4 is the result of performing a logical AND between opcode(0) and opcode(1). Thus TRACE4 is active only when opcode ="11". In accordance with FIG. 20, the AND gate can be removed and the simulator trigger conditions would be changed from TRACE4=1 to "OPCODE(0)=1 AND OPCODE(1)=1." This process would then be applied recursively to all signals remaining in the trigger condition. Thus if OPCODE(0) happened to be the result of an AND between two other signals, the AND gate could again be eliminated from the synthesized gate-level design and the trigger conditions could be updated accordingly as long as no other signals used "OPCODE(0)" as an input. If no other logic uses "OPCODE(0)" as an input, then the trigger conditions can be updated to refer to the signals used to generate OPCODE (0) and the gate-level netlist AND gate can safely be eliminated. More generally, any optimization that consists of eliminating gates and other elements by transferring the implementation of the instrumentation logic to the logic analyzer of the target simulator can be performed.

Where permitted by the gate-level simulator, the instrumentation required for detecting activation of a process may similarly be reduced. In particular, greater efficiency may be possible by keeping a list of all the signals in the process sensitivity list and then testing whether events occurred on the signals in the sensitivity list. Further optimization may be made possible by sharing the logic for signals that appear on the sensitivity list of more than one process. The original signal can be sampled once initially. A comparison is made between the initial value and the current value of the signal to generate an event signal indicative of whether an event has occurred on that signal. The event signal can then be used for instrumentation of processes with events and for tracking process activation.

FIGS. 3, 12, and 17 illustrate methods of modifying the original RTL source code for instrumenting processes and level-sensitive and edge-sensitive source code. Trace variables (i.e., instrumentation variables) can be used to track the execution of any path within the source code. Additional output signals are generated from instrumentation variables in order to detect the execution paths of the source code. In the illustrated embodiments, the instrumentation variables are reset at the beginning of a process and the signals are assigned at the end of the process in order to ensure that all the signals are assigned regardless of which execution path is taken inside the process.

In an alternative embodiment, the signals might be directly assigned in the execution path of the process. Typically, this alternative embodiment would force the synthesis tool to generate complicated structures including latches due to the nature of HDLs and simulation rules.

The methods of FIGS. 3, 12, and 17 can be applied to the source code before the source code is synthesized. Thus in one embodiment the steps that modify the RTL source code can be performed before but entirely independently of the synthesis process itself.

FIG. 21 illustrates an embodiment in which the instrumentation data is generated entirely within the synthesis process. The process of creating output signals associated with synthesizable statements in the source code and then synthesizing the source code into a gate-level design including the output signal can be incorporated into the synthesis tool itself so that modification of the RTL source code is not required.

For example, one of the steps performed by a synthesis tool for generation of the gate-level design is parsing the RTL source code. Parsing the RTL source code results in a parser data structure that is subsequently used to generate the gate-level design. Instead of modifying the source code, the synthesis tool can simply set markers inside the parser data structure.

Figure 22:
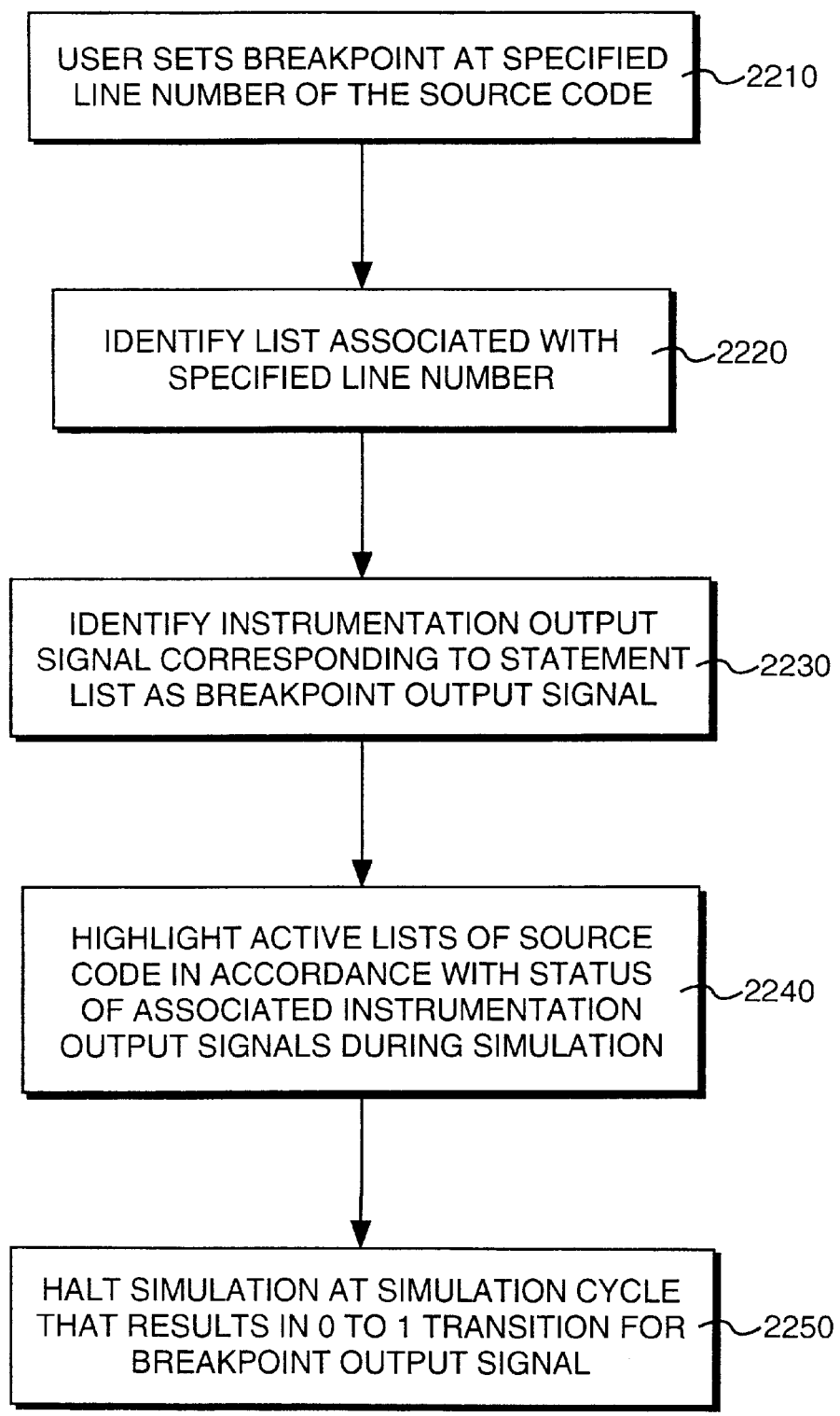
FIG. 22 illustrates a method of setting a breakpoint in RTL source code for use during gate-level simulation.

FIG. 22 illustrates one application of using the instrumentation signals for tracing execution flow using breakpoints. In step 2210, the user sets a breakpoint at a specified line number of the source code. The specified line number is then associated with one of the instrumented lists of statements in step 2220. In step 2230, the instrumentation signal for the associated list is identified as the breakpoint output signal.

During the gate-level simulation run, the active lists (identified by transitions in their corresponding instrumentation signals) may be highlighted and displayed for the user as indicated in step 2240. For example, the active lists may be portrayed in a different color than the inactive lists. Alternatively, the active lists may be displayed using blinking characters, for example. The instrumentation data file can be used to associate an instrumentation signal with a list of source code line numbers to be highlighted.

In response to a 0 to 1 transition in the breakpoint output signal, the simulation can be stopped as indicated in step 2250. Thus through instrumentation the designer has the ability to effectively set breakpoints in the RTL source code which can be acted upon during RTL simulation.

The methods of instrumentation may be implemented by a processor responding to a series of instructions. In various embodiments, these instructions may be stored in a computer system's memory such as random access memory or read only memory.

The instructions may be distributed on a nonvolatile storage medium for subsequent access and execution by the processor. Typically the instructions are stored in the storage medium for distribution to a user. The instructions may exist in an application program form or as a file stored in the storage medium. The instructions are transferred from the nonvolatile storage medium to a computer system for execution by the processor.

In one embodiment, the program or file is installed from the storage medium to the computer system such that the copy of the instructions in the nonvolatile storage medium is not necessary for performing instrumentation. In another embodiment, the program or file is configured such that the original nonvolatile storage medium is required whenever the instructions are executed.

Nonvolatile storage mediums based on magnetic, optical, or semiconductor memory storage principles are readily available. Nonvolatile magnetic storage mediums include floppy disks and magnetic tape, for example. Nonvolatile optical storage mediums include compact discs, digital video disks, etc. Semiconductor-based nonvolatile memories include rewritable flash memory.

Instrumentation allows the designer to perform gate-level simulation of synthesized RTL designs with source-level debugging. In addition, the instrumentation process allows the designer to examine source code coverage during simulation.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:

receiving an original synthesizable register transfer level (RTL) source code; and synthesizing the original RTL source code to generate a gate-level representation of the original RTL source code and also to generate instrumentation logic corresponding to at least one synthesizable statement in the original RTL source code, the instrumentation logic comprising logic circuitry in addition to logic circuitry of the gate-level representation of the original RTL source code, and the instrumentation logic to indicate an execution status of the at least one synthesizable statement of the original RTL source code during a gate-level simulation of the gate-level representation and the instrumentation logic.

2. The method of claim 1 further comprising:

synthesizing the original RTL source code to generate instrumentation information, wherein the instrumentation information comprises cross-reference instrumentation data.

3. The method of claim 1 wherein the gate-level representation of the original RTL source code and the instrumentation logic comprise a single gate-level design representation.

4. The method of claim 1 wherein synthesizing the original RTL source code to generate the gate-level representation and the instrumentation logic comprises modifying the RTL source code prior to synthesis.

5. The method of claim 1 wherein synthesizing the original RTL source code to generate the instrumentation logic comprises modifying a post parsed data structure.

6. The method of claim 1 wherein the original synthesizable RTL source code includes edge-sensitive statements.

7. The method of claim 1 wherein the original synthesizable RTL source code includes level sensitive statements.

8. The method of claim 1 further comprising:

synthesizing the original RTL source code to generate instrumentation information, wherein the instrumentation information is generated for each of a list of synthesizable statements in the original RTL source code.

9. The method of claim 2 further comprising incrementing an execution count of the at least one synthesizable statement when cross reference instrumentation data of the corresponding instrumentation information indicates the at least one synthesizable statement is active.

10. The method of claim 1 further comprising displaying the at least one synthesizable statement as a highlighted statement during simulation in accordance with an execution status of the synthesizable statement as indicated by the instrumentation logic.

11. The method of claim 2 wherein the instrumentation information further utilizes selected logic of the gate-level representation of the RTL source.

12. A machine readable medium having stored therein machine executable instructions, wherein when executed the instructions enable the machine to:

receive an original synthesizable register transfer level (RTL) source code; and synthesize the original RTL source code to generate a gate-level representation of the original RTL source code and also to generate instrumentation logic corresponding to at least one synthesizable statement in the original RTL source code, the instrumentation logic comprising logic circuitry in addition to logic circuitry of the gate-level representation of the original RTL source code, and the instrumentation logic to indicate an execution status of the at least one synthesizable statement of the original RTL source code during a gate-level simulation of the gate-level representation and the instrumentation logic.

13. The machine readable medium of claim 12 wherein the instructions further enable the machine to:

synthesize the original RTL source code to generate instrumentation information, wherein the instrumentation information comprises cross-reference instrumentation data.

14. The machine readable medium of claim 12 wherein synthesizing the original RTL source code to generate the gate-level representation and the instrumentation logic comprises modifying the RTL source code prior to synthesis.

15. The machine readable medium of claim 12 wherein synthesizing the original RTL source code to generate the instrumentation logic comprises modifying a post parsed data structure.

16. The machine readable medium of claim 12 wherein the instructions further enable the machine to:

synthesize the original RTL source code to generate instrumentation information, wherein the instrumentation information is generated for each of a list of synthesizable statements in the original RTL source code.

17. The machine readable medium of claim 13 further comprising incrementing an execution count of the at least one synthesizable statement when cross reference instrumentation data of the corresponding instrumentation information indicates the at least one synthesizable statement is active.

18. The machine readable medium of claim 12 further comprising displaying the at least one synthesizable statement as a highlighted statement during simulation in accordance with an execution status of the synthesizable statement as indicated by the instrumentation logic.

* * * * *